(12) United States Patent
Lin et al.

(10) Patent No.: US 11,239,168 B2
(45) Date of Patent: Feb. 1, 2022

(54) CHIP PACKAGE STRUCTURE

(71) Applicant: Industrial Technology Research Institute, Hsinchu (TW)

(72) Inventors: Hsin-Han Lin, Hsinchu County (TW); Yu-Min Lin, Hsinchu County (TW); Tao-Chih Chang, Taoyuan (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 16/849,999

(22) Filed: Apr. 16, 2020

(65) Prior Publication Data
US 2021/0035914 A1 Feb. 4, 2021

Related U.S. Application Data

(60) Provisional application No. 62/880,628, filed on Jul. 30, 2019.

(30) Foreign Application Priority Data

Dec. 23, 2019 (TW) .................................. 108147206

(51) Int. Cl.
*H01L 23/538* (2006.01)
*H01L 23/367* (2006.01)
(Continued)

(52) U.S. Cl.
CPC .......... *H01L 23/5384* (2013.01); *H01L 23/31* (2013.01); *H01L 23/367* (2013.01); *H01L 25/0657* (2013.01)

(58) Field of Classification Search
CPC . H01L 23/5389; H01L 23/5384; H01L 23/31; H01L 23/367; H01L 24/19; H01L 24/20; H01L 24/32
See application file for complete search history.

(56) References Cited

U.S. PATENT DOCUMENTS 6,313,528 B1 * 11/2001 Solberg ............... H01L 25/0657
257/668
9,583,411 B2 * 2/2017 Katkar .................. H01L 21/568
(Continued)

FOREIGN PATENT DOCUMENTS

| CN | 109148394 | 1/2019 |
| TW | 200947664 | 11/2009 |

(Continued)

OTHER PUBLICATIONS

"Office Action of Taiwan Counterpart Application", dated Apr. 9, 2021, p. 1-p. 7.

*Primary Examiner* — Zandra V Smith
*Assistant Examiner* — John M Parker
(74) *Attorney, Agent, or Firm* — JCIPRNET

(57) ABSTRACT

A chip package structure including first and second insulating layers, first and second circuit structures, a chip on the first circuit structure, an encapsulant, a conductive through via, and first and second heat dissipation layers is provided. The first circuit structure is disposed at the first surface of the first insulating layer. The bottom electrode of the chip is electrically connected to the first circuit structure. The second circuit structure is disposed on the chip and electrically connected to the top electrode of the chip. The encapsulant encapsulates the first and second circuit structures and the chip. The conductive through via is disposed in the encapsulant and connects the first and second circuit structures. The second insulating layer is disposed on the second circuit structure. The first heat dissipation layer is disposed on the first insulating layer. The second heat dissipation layer is disposed on the second insulating layer.

19 Claims, 9 Drawing Sheets

(51) Int. Cl.
*H01L 23/31* (2006.01)
*H01L 25/065* (2006.01)

(56) References Cited

U.S. PATENT DOCUMENTS

| | | | |
|---|---|---|---|
| 10,083,919 B2 | 9/2018 | Li | |
| 10,096,578 B1 | 10/2018 | Yeh et al. | |
| 10,381,326 B2 * | 8/2019 | Woychik | H01L 21/6835 |
| 2007/0267746 A1 * | 11/2007 | Bernstein | H01L 25/0655 |
| | | | 257/738 |
| 2010/0301474 A1 * | 12/2010 | Yang | H01L 24/29 |
| | | | 257/737 |
| 2011/0037154 A1 * | 2/2011 | Shim | H01L 23/3114 |
| | | | 257/676 |
| 2011/0045634 A1 * | 2/2011 | Pagaila | H01L 24/96 |
| | | | 438/107 |
| 2016/0190059 A1 * | 6/2016 | Tseng | H01L 21/7685 |
| | | | 257/774 |
| 2018/0096968 A1 * | 4/2018 | Lee | H01L 24/19 |

FOREIGN PATENT DOCUMENTS

| | | |
|---|---|---|
| TW | 201005897 | 2/2010 |
| TW | 201208004 | 2/2012 |
| TW | 201227884 | 7/2012 |
| TW | 201436684 | 9/2014 |
| TW | 201448139 | 12/2014 |
| TW | 201625100 | 7/2016 |
| TW | I556374 | 11/2016 |

\* cited by examiner

CHIP PACKAGE STRUCTURE

CROSS-REFERENCE TO RELATED APPLICATION

This application claims the priority benefits of U.S. provisional application Ser. No. 62/880,628, filed on Jul. 30, 2019, and Taiwan application serial no. 108147206, filed on Dec. 23, 2019. The entirety of each of the above-mentioned patent applications is hereby incorporated by reference herein and made a part of this specification.

TECHNICAL FIELD

The present application relates to a chip package structure, and more particularly, to a chip package structure of a power chip.

BACKGROUND

In the traditional manufacturing process, a driving control system chip and a power module chip in an electric motor are generally manufactured separately, and the foregoing two types of chips are finished on an assembled circuit board. In order to pursue the object of miniaturization, a process technique of combining a driving control system chip and a power module chip into an intelligent power module (IPM) is currently developed to achieve the object of reducing the structure volume and simplifying the process.

Today's semiconductor elements use a variety of package types based on process needs, such as: dual in-line package (DIP), thin small outline package (TSOP), and quad-flat no-leads (QFN), etc. The various packaging forms mostly adopt wire bonding techniques of metal wires to combine the chip with a lead frame, so that the chip may be connected to an external circuit. Then, the structure is encapsulated with an encapsulant. However, the above type of package structure has the issue of poor heat dissipation efficiency, thus limiting the applicable specifications of electric motor products.

SUMMARY

The present application provides a chip package structure including a heat dissipation layer that does not have a function of transmitting electrical signals.

The chip package structure of the present application includes a first insulating layer, a first circuit structure, a first chip, a second circuit structure, an encapsulant, a conductive through via, a second insulating layer, a first heat dissipation layer, and a second heat dissipation layer. The first insulating layer has a first surface and a second surface opposite to each other. The first circuit structure is disposed at the first surface. The first chip is disposed on the first circuit structure, wherein the first chip has a top electrode and a bottom electrode, and the bottom electrode is electrically connected to the first circuit structure. The second circuit structure is disposed on the first chip and electrically connected to the top electrode. The encapsulant is disposed on the first insulating layer and encapsulates the first circuit structure, the first chip, and the second circuit structure. The conductive through via is disposed in the encapsulant and connected to the first circuit structure and the second circuit structure. The second insulating layer is disposed on the second circuit structure. The first heat dissipation layer is disposed on the second surface. The second heat dissipation layer is disposed on the second insulating layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

FIG. 1A to FIG. 1E are cross-sectional views of a manufacturing process of a chip package structure shown according to the first embodiment of the present application.

Figure 1A:
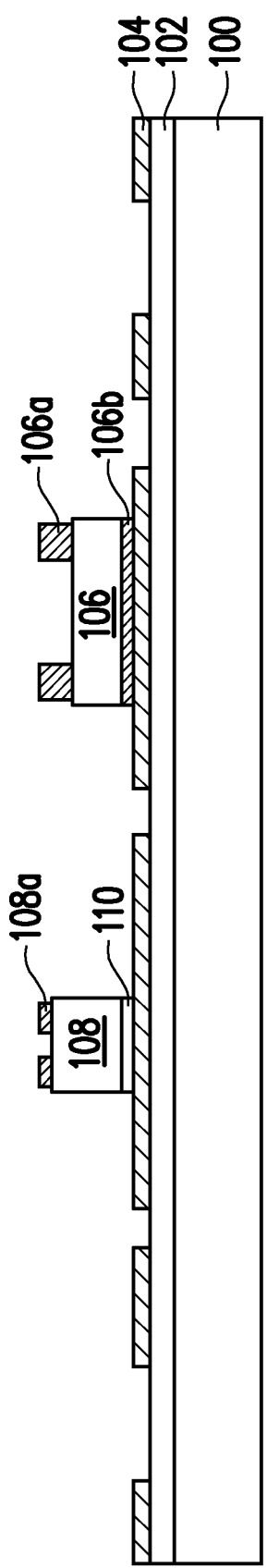
FIG. 1A to FIG. 1E are cross-sectional views of a manufacturing process of a chip package structure shown according to the first embodiment of the present application.

Referring to FIG. 1A, a release layer 102 is formed on a carrier substrate 100. The carrier substrate 100 is, for example, a silicon substrate or a glass substrate. Then, a first circuit structure 104 is formed on the release layer 102. In the present embodiment, the first circuit structure 104 is, for example, a copper circuit layer, but the disclosure is not limited thereto. The first circuit structure 104 may be formed by various well-known processes, such as a chemical vapor deposition process, a physical vapor deposition process, a sputtering process, a subtractive process, an additive process, a semi-additive process, or a modified semi-additive process (MSAP).

Next, a first chip 106 and a second chip 108 are disposed on the first circuit structure 104. In the present embodiment, the first chip 106 is different from the second chip 108. The first chip 106 is a power chip, and the second chip 108 is not a power chip (such as a driving chip). The first chip 106 has a top electrode 106a and a bottom electrode 106b. The second chip 108 has a top electrode 108a. In the present embodiment, the first chip 106 is directly bonded on the first circuit structure 104, so that the bottom electrode 106b of the first chip 106 is directly connected to the first circuit structure 104. In other embodiments, a metal connection layer may be provided between the bottom electrode 106b of the first chip 106 and the first circuit structure 104, so that the bottom electrode 106b of the first chip 106 and the first circuit structure 104 may be firmly bonded. The metal connection layer is, for example, a silver layer, a copper layer, or a tin layer. Alternatively, the bottom electrode 106b of the first chip 106 and the first circuit structure 104 may also be bonded by a conductive paste, a conductive pillar, or other suitable methods. In addition, the second chip 108 is bonded on the first circuit structure 104 via an adhesive layer 110.

In addition, in the present embodiment, the first circuit structure 104 is provided with the first chip 106 and the second chip 108 on top, but the disclosure is not limited thereto. In other embodiments, the first chip 106 may be disposed on the first circuit structure 104, that is, the power chip is disposed on the first circuit structure 104. In addition, the number of the first chip 106 and the second chip 108 is not limited to that shown in FIG. 1A, and a plurality of the first chip 106 and the second chip 108 may be provided according to actual needs.

Figure 1B:
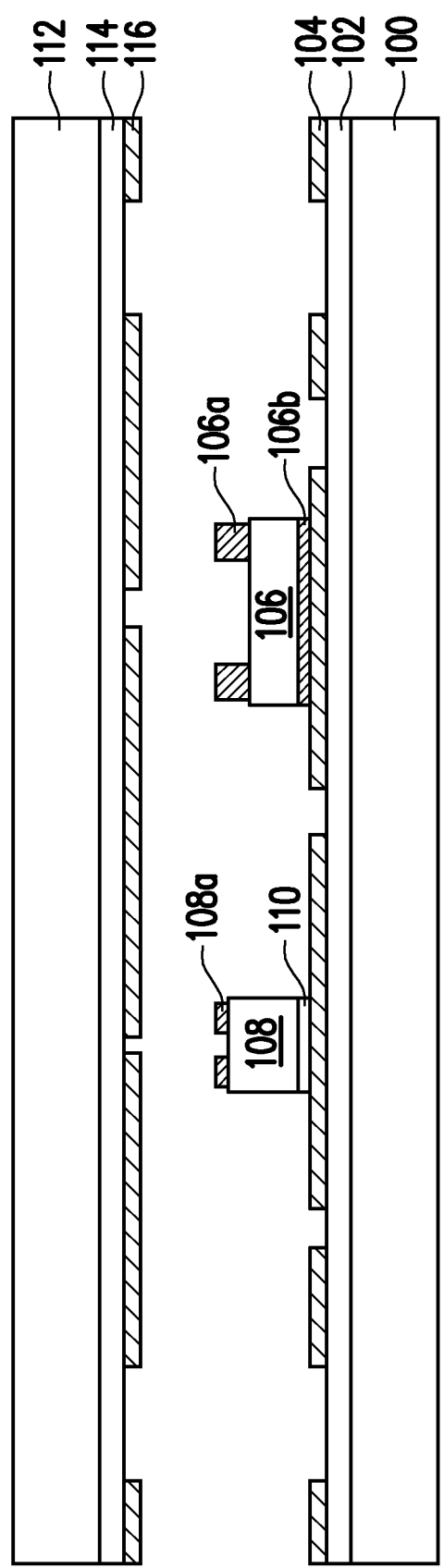

Referring to FIG. 1B, a release layer 114 is formed on the carrier substrate 112. The carrier substrate 112 is, for example, a silicon substrate or a glass substrate. Then, a second circuit structure 116 is formed on the release layer 114. In the present embodiment, the second circuit structure 116 is, for example, a copper circuit layer, but the disclosure is not limited thereto. The second circuit structure 116 may be formed by various well-known processes, such as a chemical vapor deposition process, a physical vapor deposition process, a sputtering process, a subtractive process, an additive process, a semi-additive process, or a modified semi-additive process (MSAP).

Next, the second circuit structure 116 is bonded to the first chip 106 and the second chip 108 with the second circuit structure 116 facing the first chip 106 and the second chip 108. In this way, the top electrode 106a of the first chip 106 may be directly connected to the second circuit structure 116, and the top electrode 108a of the second chip 108 may also be directly connected to the second circuit structure 116. In other embodiments, a metal connection layer may be provided between the top electrode 106a of the first chip 106 and the second circuit structure 116 and between the top electrode 108a of the second chip 108 and the second circuit structure 116. That is, before the second circuit structure 116 is bonded to the first chip 106 and the second chip 108, a metal connection layer may be first formed on the second circuit structure 116 or the top electrode 106a of the first chip 106 and the top electrode 108a of the second chip 108. Alternatively, the top electrode 106a of the first chip 106, the top electrode 108a of the second chip 108, and the second circuit structure 116 may also be bonded by a conductive paste, a conductive pillar, or other suitable methods.

Figure 1C:
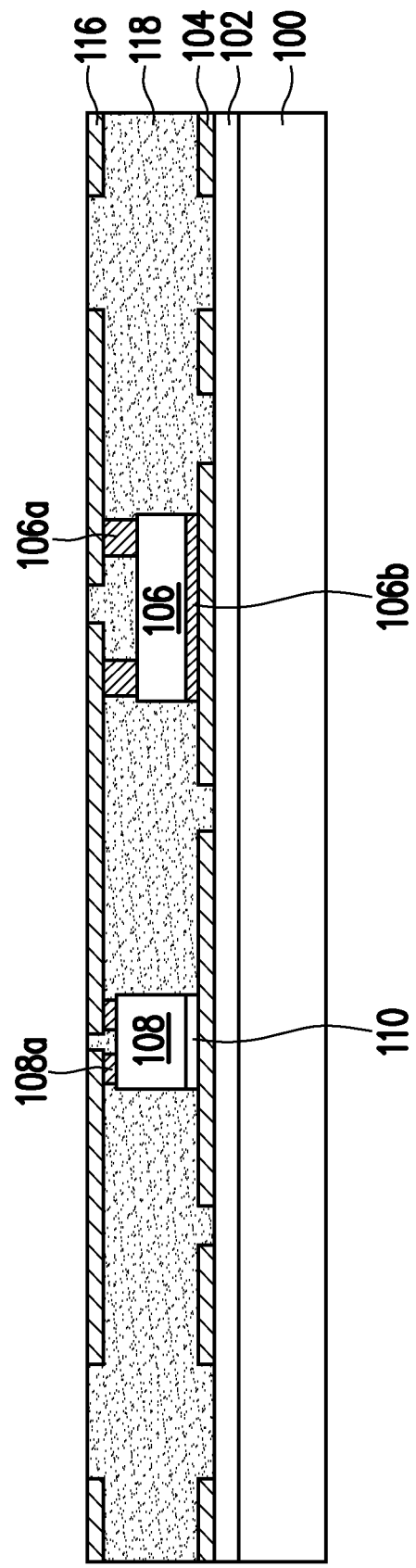

Referring to FIG. 1C, after the second circuit structure 116 is bonded to the first chip 106 and the second chip 108, the carrier substrate 112 and the release layer 114 are removed. Then, an encapsulant 118 is formed via a mold process. The encapsulant 118 encapsulates the first circuit structure 104, the first chip 106, the second chip 108, and the second circuit structure 116. In the present embodiment, the encapsulant 118 exposes the top surface of the second circuit structure 116, that is, the second circuit structure 116 is entirely buried in the encapsulant 118 and the top surface of the second circuit structure 116 and the surface of the encapsulant 118 are level, but the disclosure is not limited thereto. In other embodiments, the second circuit structure 116 may be partially buried in the encapsulant 118, that is, the top surface of the second circuit structure 116 may be protruded from the surface of the encapsulant 118.

Figure 1D:
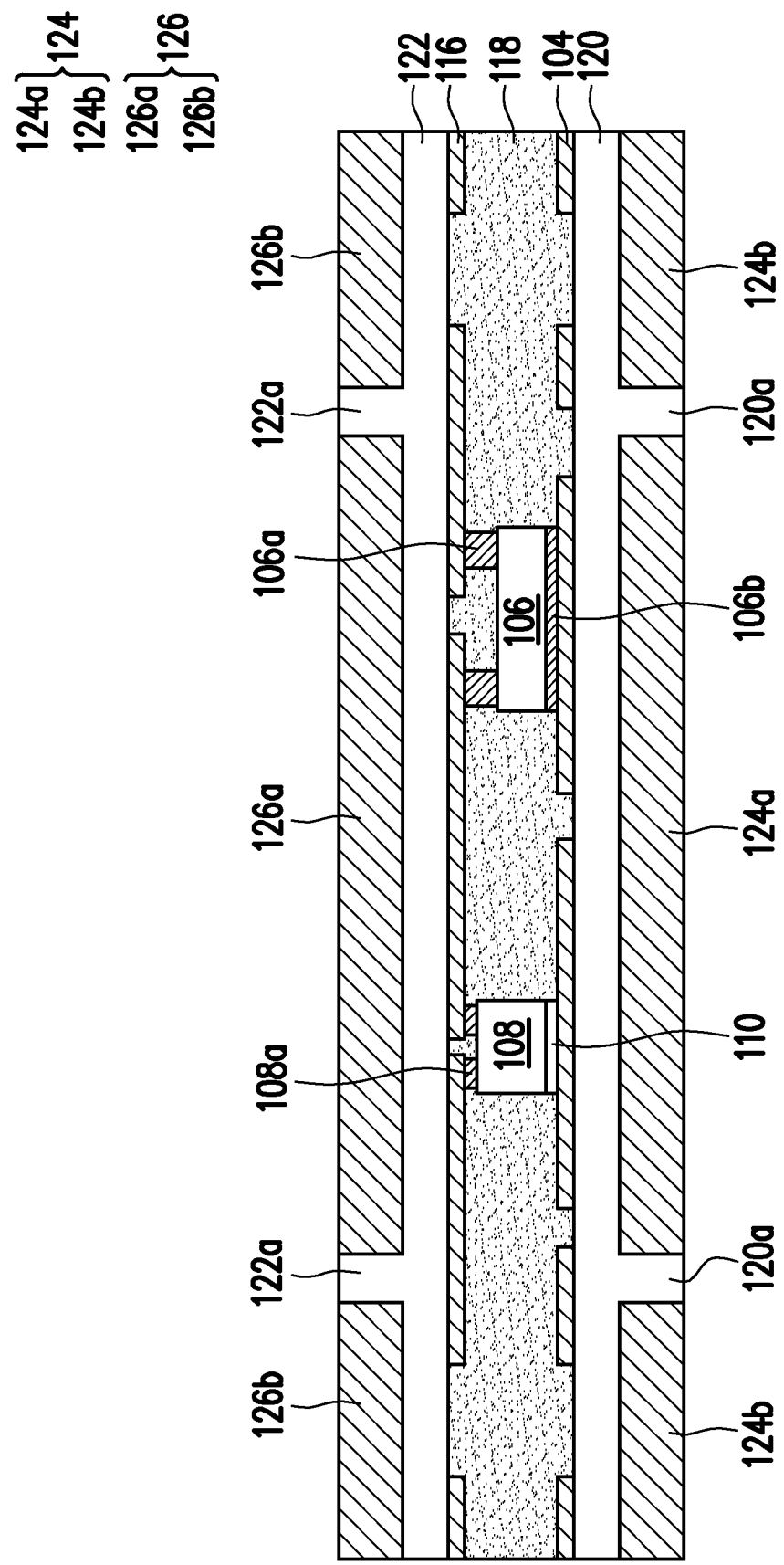

Referring to FIG. 1D, after the encapsulant 118 is formed, the carrier substrate 100 and the release layer 102 are removed. Next, a first insulating layer 120 and a second insulating layer 122 are formed on the first circuit structure 104 and the second circuit structure 116, respectively, and a first conductive layer 124 and a second conductive layer 126 are formed on the first insulating layer 120 and the second insulating layer 122, respectively. The first conductive layer 124 may be a metal layer, and the second conductive layer 126 may be a metal layer, but the disclosure is not limited thereto. The first insulating layer 120, the second insulating layer 122, the first conductive layer 124, and the second conductive layer 126 may be formed by a lamination process, but the disclosure is not limited thereto.

Figure 6:
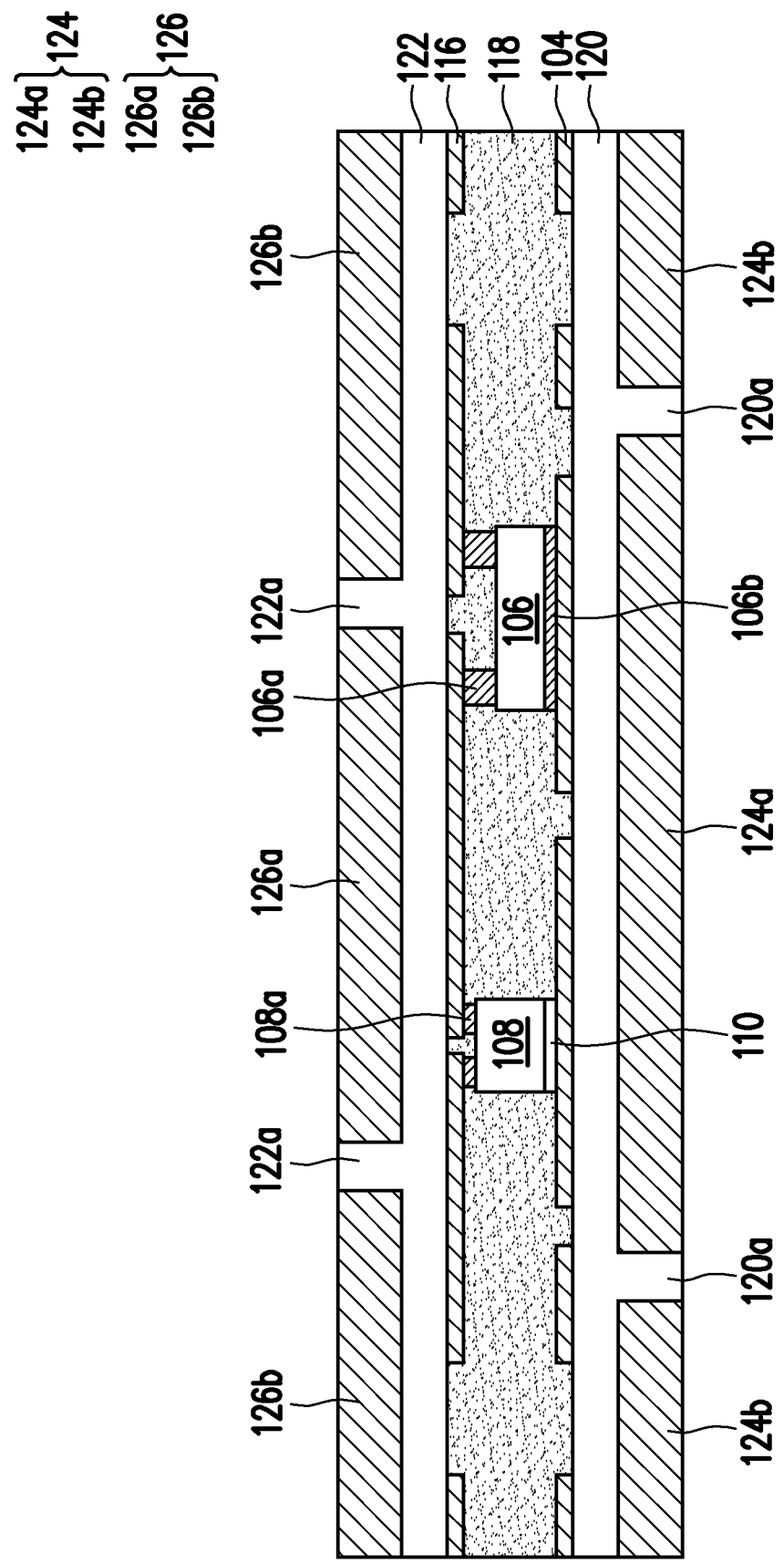
FIG. 6 is a cross-sectional view of a chip package structure according to another embodiment of the present application.

In the present embodiment, the first insulating layer 120 has a spacer 120a to separate the first conductive layer 124 into a heat dissipation layer 124a and a third circuit structure 124b, and the second insulating layer 122 has a spacer 122a to separate the second conductive layer 126 into a heat dissipation layer 126a and a fourth circuit structure 126b. In addition, in the present embodiment, the first insulating layer 120 covers the entire first circuit structure 104, and the second insulating layer 122 covers the entire second circuit structure 116. That is, in the present embodiment, the upper side and the lower side of the encapsulant 118 may be regarded as having a symmetrical structure. In this way, a subsequent process and structure design may be facilitated, and warping of the resulting chip package structure may be avoided. In the symmetrical structure, the position of the spacer 120a and the position of the spacer 122a may or may not correspond to each other according to actual needs. For example, as shown in FIG. 6, the position of the spacer 120a and the position of the spacer 122a do not correspond to each other, that is, the first conductive layer 124 and the second conductive layer 126 have different patterns, but the upper side and the lower side of the encapsulant 118 may still be considered as having a symmetrical structure.

Figure 1E:
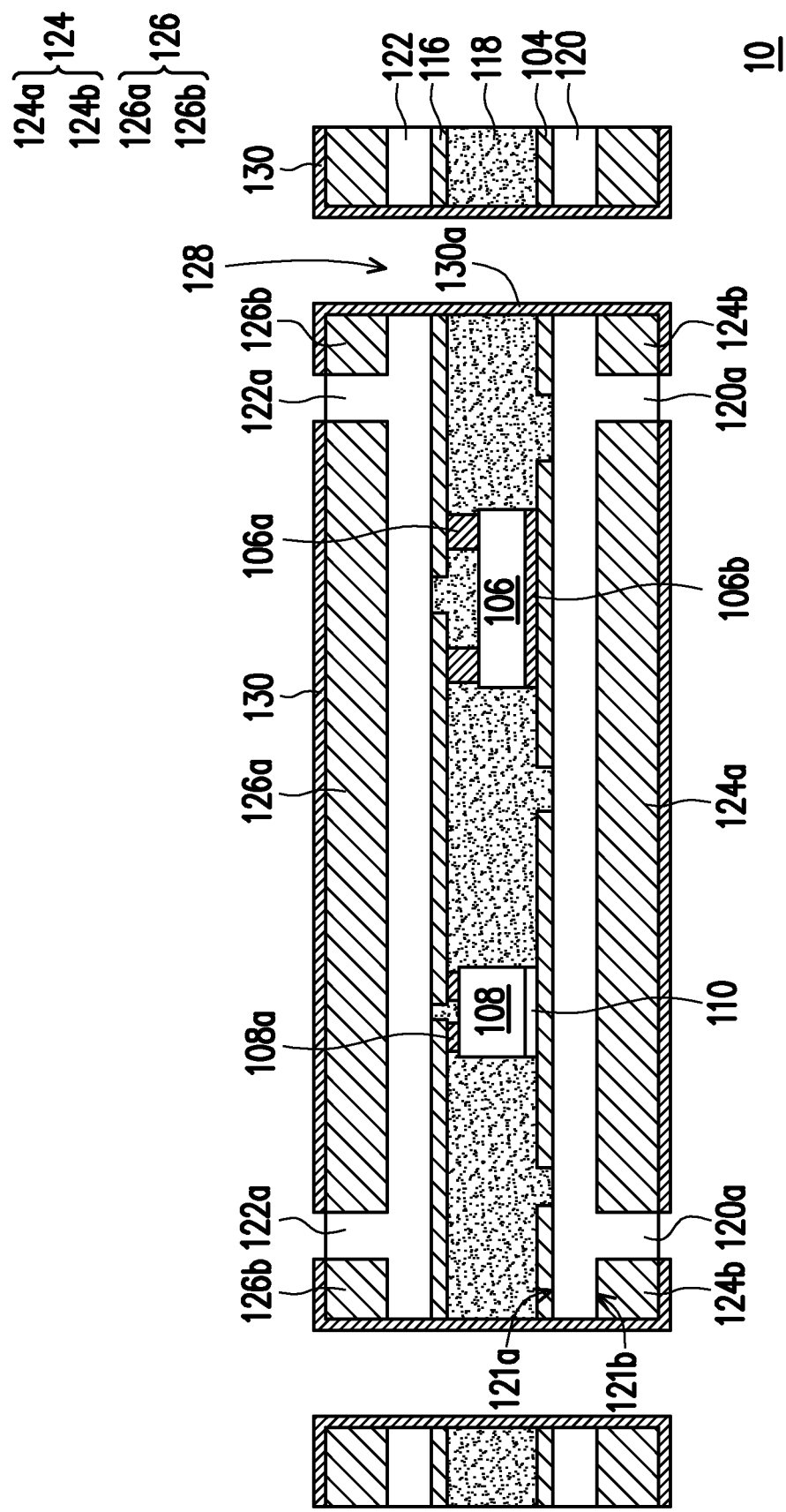

Referring to FIG. 1E, a drilling process is performed to form a through via 128. In the present embodiment, the through via 128 penetrates the third circuit structure 124b, the first insulating layer 120, the first circuit structure 104, the encapsulant 118, the second circuit structure 116, the second insulating layer 122, and the fourth circuit structure 126b. The drilling process is, for example, a mechanical drilling process or a laser drilling process. Next, a plating process is performed to form a conductive layer 130 on the sidewall of the through via 128, the first conductive layer 124, and the second conductive layer 126. In this way, the manufacture of the chip package structure 10 of the present embodiment is completed. In the present embodiment, the conductive layer 130 located in the through via 128 is connected to the first circuit structure 104, the second circuit structure 116, the third circuit structure 124b, and the fourth circuit structure 126b. Therefore, the conductive layer 130 located in the through via 128 may be regarded as a conductive through via 130a.

The chip package structure of the first embodiment of the present application is described below with the chip package structure 10.

Referring to FIG. 1E, the chip package structure 10 includes the first circuit structure 104, the first chip 106, the second chip 108, the second circuit structure 116, the first insulating layer 120, the encapsulant 118, the second insulating layer 122, the first conductive layer 124, the second conductive layer 126, and the conductive through via 130a. The first insulating layer 120 has a first surface 121a and a second surface 121b opposed to each other. The first circuit structure 104 is disposed at the first surface 121a. The first chip 106 and the second chip 108 are disposed on the first circuit structure 104. The bottom electrode 106b of the first chip 106 is electrically connected to the first circuit structure 104. The second chip 108 is bonded on the first circuit structure 104 via the adhesive layer 110. The second circuit structure 116 is disposed on the first chip 106 and the second chip 108. The second circuit structure 116 is electrically connected to the top electrode 106a of the first chip 106 and the top electrode 108a of the second chip 108. The encapsulant 118 is disposed on the first insulating layer 120 and encapsulates the first circuit structure 104, the first chip 106, the second chip 108, and the second circuit structure 116. The second insulating layer 122 is disposed on the second circuit structure 116 and covers the entire second circuit structure 116. The first conductive layer 124 is disposed on the second surface 121b and includes the heat dissipation layer 124a and the third circuit structure 124b. The second conductive layer 126 is disposed on the second insulating layer 122 and includes the heat dissipation layer 126a and the fourth circuit structure 126b. The conductive through via 130a penetrates the third circuit structure 124b, the first insulating layer 120, the first circuit structure 104, the encapsulant 118, the second circuit structure 116, the second insulating layer 122, and the fourth circuit structure 126b to be connected to the first circuit structure 104, the second circuit structure 116, the third circuit structure 124b, and the fourth circuit structure 126b.

In the chip package structure 10, the heat dissipation layer 124a is electrically insulated from the third circuit structure 124b via the spacer 120a. Therefore, the heat dissipation layer 124a is used for conducting heat generated during the operation of the first chip 106 and the second chip 108 to the outside and does not have the function of transmitting electrical signals, that is, the heat generated during the operation of the first chip 106 and the second chip 108 may be conducted to the outside via the heat dissipation layer 124a and a heat sink (not shown) connected thereto. Similarly, the heat dissipation layer 126a is electrically insulated from the fourth circuit structure 126b via the spacer 122a. Therefore, the heat dissipation layer 126a is used for conducting heat generated during the operation of the first chip 106 and the second chip 108 to the outside and does not have the function of transmitting electrical signals, that is, the heat generated during the operation of the first chip 106 and the second chip 108 may be conducted to the outside via the heat dissipation layer 126a and a heat sink (not shown) connected thereto.

The first circuit structure 104, the second circuit structure 116, the third circuit structure 124b, and the fourth circuit structure 126b are electrically connected to each other via the conductive through via 130a. Therefore, the electric signal generated by the first chip 106 and the second chip 108 during operation may be transmitted to an external device. For example, when the third circuit structure 124b and the fourth circuit structure 126b are connected to a connection device (such as a wire or a connecting screw), the electrical signals may be transmitted to an external signal receiving device from the first chip 106 and the second chip 108 via the first circuit structure 104, the second circuit structure 116, the third circuit structure 124b, the fourth circuit structure 126b, and the connection device.

In the present embodiment, the heat dissipation layers 124a and 126a as the heat dissipation elements are respectively located in the central region of the upper and lower sides of the chip package structure 10, so that a greater heat dissipation area may be achieved to improve heat dissipation effect. In addition, since the heat dissipation layers 124a and 126a are located in the central region of the chip package structure 10, and the circuit structure and conductive through via for transmitting electrical signals are located in the peripheral portion of the chip package structure 10, the chance of the user touching the conductive region may be reduced. In addition, the conductive through via and circuit structure located in the periphery of the heat dissipation layers 124a and 126a have the function of dissipating heat in addition to the function of transmitting electrical signals.

In the chip package structure 10, the upper side and the lower side of the encapsulant 118 have a symmetrical structure, but the disclosure is not limited thereto. In other embodiments, an asymmetric structure may be provided on the upper side and the lower side of the encapsulant 118 according to actual needs, which is described below.

Figure 2:
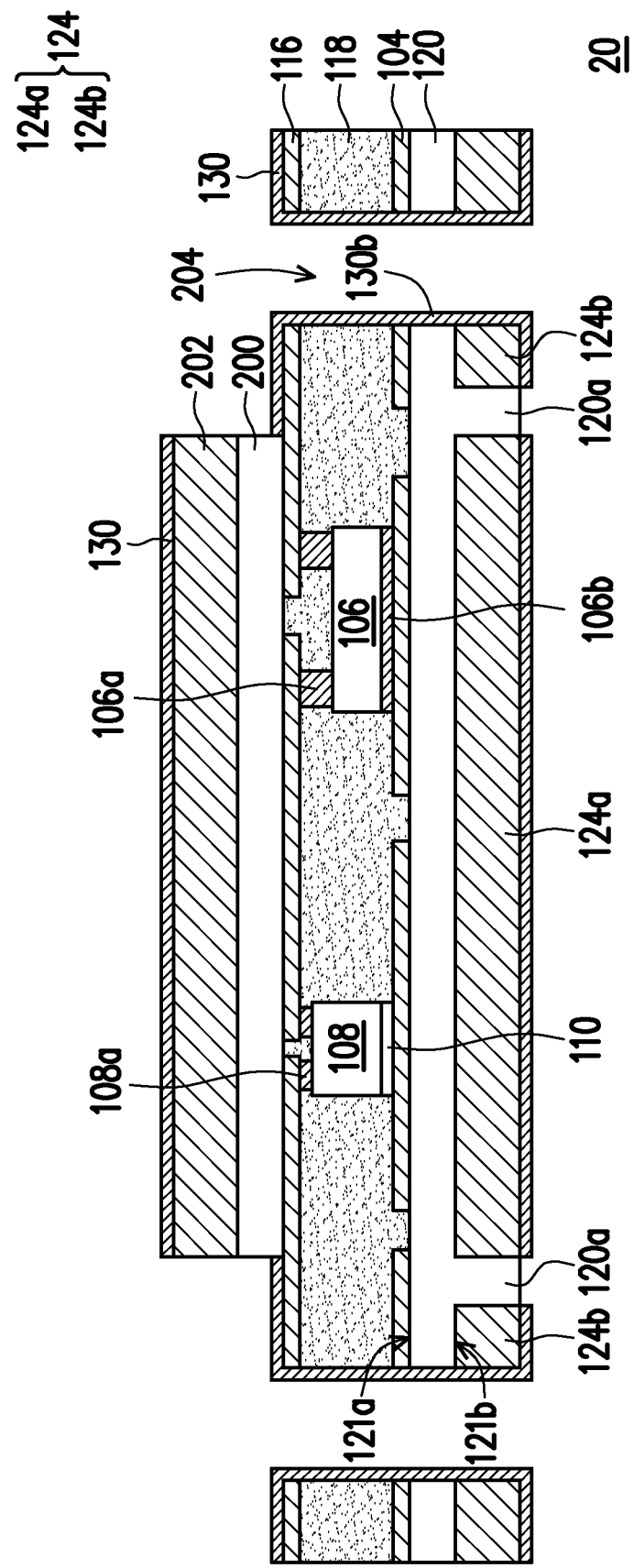
FIG. 2 is a cross-sectional view of a chip package structure according to the second embodiment of the present application.

FIG. 2 is a cross-sectional view of a chip package structure according to the second embodiment of the present application. In the present embodiment, the same elements as the first embodiment are labeled with the same reference numerals and are not repeated herein.

Referring to FIG. 2, in the present embodiment, a chip package structure 20 includes the first circuit structure 104, the first chip 106, the second chip 108, the second circuit structure 116, the first insulating layer 120, the encapsulant 118, a second insulating layer 200, the first conductive layer 124, a second conductive layer 202, and a conductive through via 130b. The second insulating layer 200 exposes a portion of the second circuit structure 116, and the second conductive layer 202 is disposed on the second insulating layer 200 to be electrically insulated from the second circuit structure 116. In addition, a through via 204 penetrates the third circuit structure 124b, the first insulating layer 120, the first circuit structure 104, the encapsulant 118, and the second circuit structure 116, so that the conductive layer 130 located in the through via 204 is connected to the first circuit structure 104, the second circuit structure 116, and the third circuit structure 124b. Therefore, the conductive layer 130 located in the through via 204 may be regarded as the conductive through via 130b.

The second insulating layer 200 is disposed in the central region of the chip package structure 20, so the entire second conductive layer 202 may be used as a heat dissipation layer and does not include a circuit structure. That is, in the present embodiment, the second conductive layer 202 is used as a heat dissipation element and does not have the function of transmitting electrical signals. In addition, the heat dissipation layer 124a and the second conductive layer 202 also have a function of shielding noise at the same time.

The first circuit structure 104, the second circuit structure 116, and the third circuit structure 124b are electrically connected to each other via the conductive through via 130b. Therefore, the electrical signals generated by the first chip 106 and the second chip 108 during operation may be transmitted to an external device. For example, when the second circuit structure 116 and the third circuit structure 124b are connected to a connection device (such as a wire or a connecting screw), the electrical signals may be transmitted to an external signal receiving device from the first chip 106 and the second chip 108 via the first circuit structure 104, the second circuit structure 116, the third circuit structure 124b, and the connection device.

In addition, in the present embodiment, the second conductive layer 202 as the heat dissipation element has the same size as the heat dissipation layer 124a, but the disclosure is not limited thereto. In other embodiments, the size of the second conductive layer 202 as the heat dissipation element may be greater or smaller than the size of the heat dissipation layer 124a.

Figure 3:
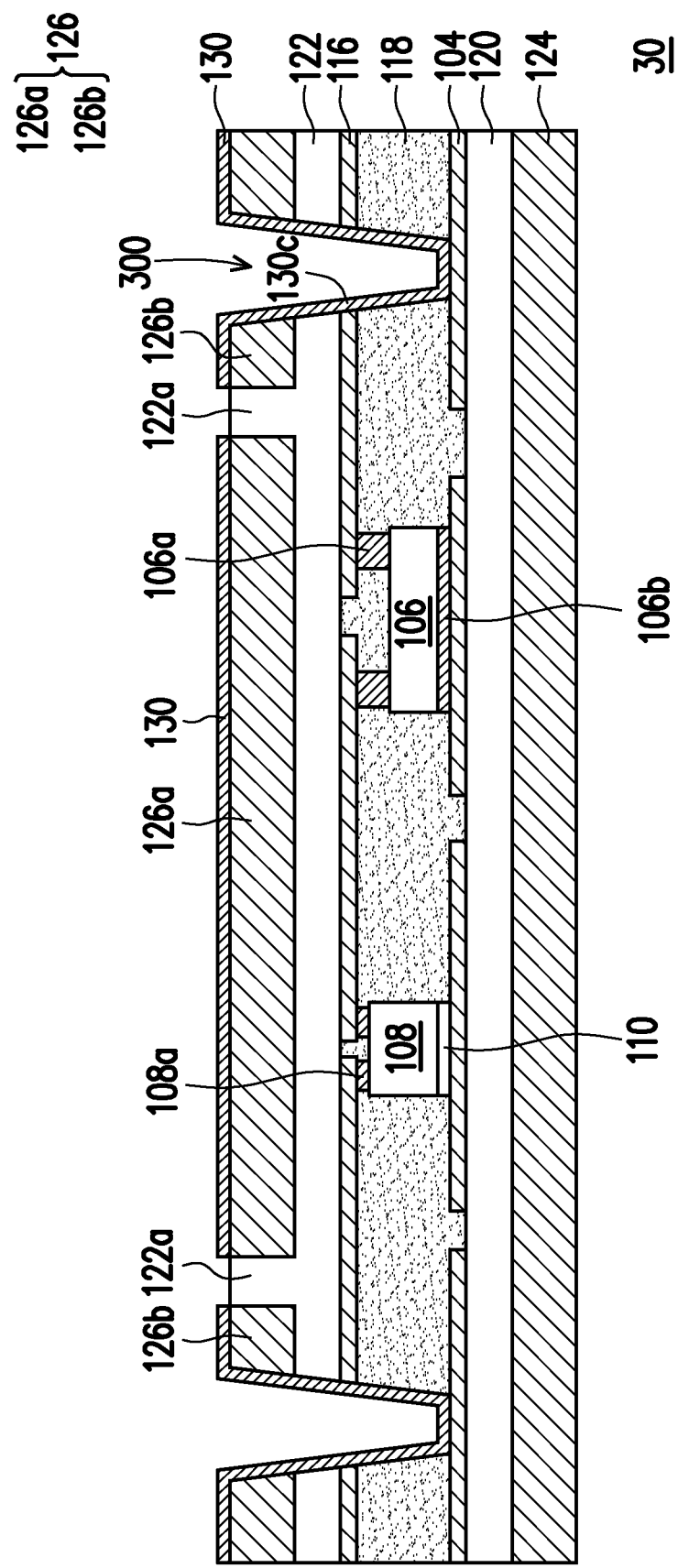
FIG. 3 is a cross-sectional view of a chip package structure according to the third embodiment of the present application.

FIG. 3 is a cross-sectional view of a chip package structure according to the third embodiment of the present application. In the present embodiment, the same elements as the first embodiment are labeled with the same reference numerals and are not repeated herein.

Referring to FIG. 3, in the present embodiment, a chip package structure 30 includes the first circuit structure 104, the first chip 106, the second chip 108, the second circuit structure 116, the first insulating layer 120, the encapsulant 118, the second insulating layer 122, the first conductive layer 124, the second conductive layer 126, and a conductive through via 130c. A through via 300 penetrates the encapsulant 118, the second circuit structure 116, the second insulating layer 122, and the fourth circuit structure 126b and exposes a portion of the first circuit structure 104, so that the conductive layer 130 located in the through via 300 is connected to the first circuit structure 104, the second circuit structure 116, and the fourth circuit structure 126b. Therefore, the conductive layer 130 located in the through via 300 may be regarded as the conductive through via 130c. Since the conductive through via 130c is not connected to the first conductive layer 124, the entire first conductive layer 124 may be used as a heat dissipation layer and does not include a circuit structure. That is, in the present embodiment, the first conductive layer 124 is used as a heat dissipation element and does not have a function of transmitting electrical signals, and therefore the heat dissipation area of the lower side of the chip package structure 30 may be maximized. In addition, the first conductive layer 124 and the heat dissipation layer 126a also have a function of shielding noise at the same time.

The first circuit structure 104, the second circuit structure 116, and the fourth circuit structure 126b are electrically connected to each other via the conductive through via 130c. Therefore, the electrical signals generated by the first chip 106 and the second chip 108 during operation may be transmitted to an external device. For example, when the fourth circuit structure 126b is connected to a connection device (such as a wire or a connecting screw), the electrical signals may be transmitted to an external signal receiving device from the first chip 106 and the second chip 108 via the first circuit structure 104, the second circuit structure 116, the fourth circuit structure 126b, and the connection device.

Figure 4:
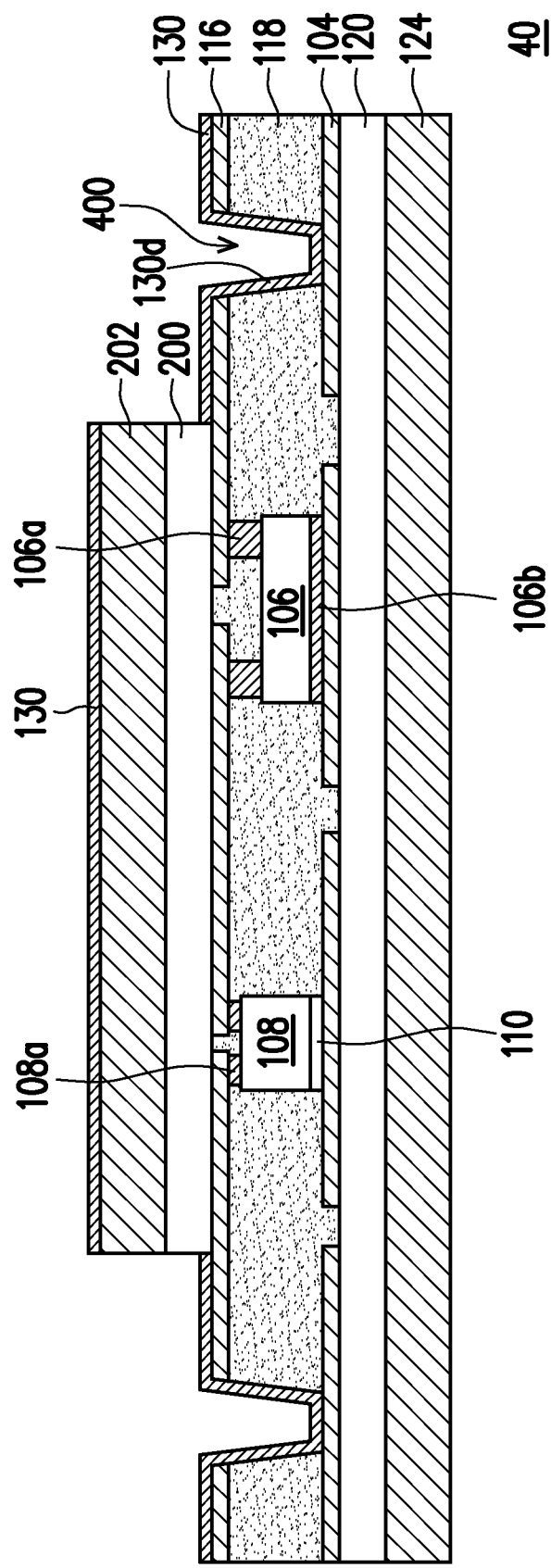
FIG. 4 is a cross-sectional view of a chip package structure according to the fourth embodiment of the present application.

FIG. 4 is a cross-sectional view of a chip package structure according to the fourth embodiment of the present application. In the present embodiment, the same elements as the first embodiment, the second embodiment, and the third embodiment are labeled with the same reference numerals and are not repeated herein.

Referring to FIG. 4, in the present embodiment, a chip package structure 40 includes the first circuit structure 104, the first chip 106, the second chip 108, the second circuit structure 116, the first insulating layer 120, the encapsulant 118, the second insulating layer 200, the first conductive layer 124, the second conductive layer 202, and a conductive through via 130d. The second insulating layer 200 exposes a portion of the second circuit structure 116, and the second conductive layer 202 is disposed on the second insulating layer 200 to be electrically insulated from the second circuit structure 116. A through via 400 penetrates the encapsulant 118 and the second circuit structure 116 and exposes a portion of the first circuit structure 104, so that the conductive layer 130 located in the through via 400 is connected to the first circuit structure 104 and the second circuit structure 116. Therefore, the conductive layer 130 located in the through via 400 may be regarded as the conductive through via 130d. Since the conductive through via 130d is not connected to the first conductive layer 124, the entire first conductive layer 124 may be used as a heat dissipation layer and does not include a circuit structure. That is, in the present embodiment, the first conductive layer 124 is used as a heat dissipation element and does not have a function of transmitting electrical signals, and therefore the heat dissipation area of the lower side of the chip package structure 40 may be maximized. In addition, the first conductive layer 124 and the second conductive layer 202 also have a function of shielding noise at the same time.

Moreover, the second insulating layer 200 is disposed in the central region of the chip package structure 40, so the entire second conductive layer 202 may be used as a heat dissipation layer and does not include a circuit structure. That is, in the present embodiment, the second conductive layer 202 is used as a heat dissipation element and does not have the function of transmitting electrical signals.

The first circuit structure 104 and the second circuit structure 116 are electrically connected to each other via the conductive through via 130d. Therefore, the electrical signals generated by the first chip 106 and the second chip 108 during operation may be transmitted to an external device. For example, when the second circuit structure 116 is connected to a connection device (such as a wire or a connecting screw), the electrical signals may be transmitted to an external signal receiving device from the first chip 106 and the second chip 108 via the first circuit structure 104, the second circuit structure 116, and the connection device.

In each of the above embodiments, the first chip 106 and the second chip 108 are directly covered by the encapsulant 118, but the disclosure is not limited thereto. In other embodiments, the first chip 106 and the second chip 108 may also be disposed in a groove of the circuit board, and the encapsulant 118 encapsulates the circuit board, which is described below.

Figure 5:
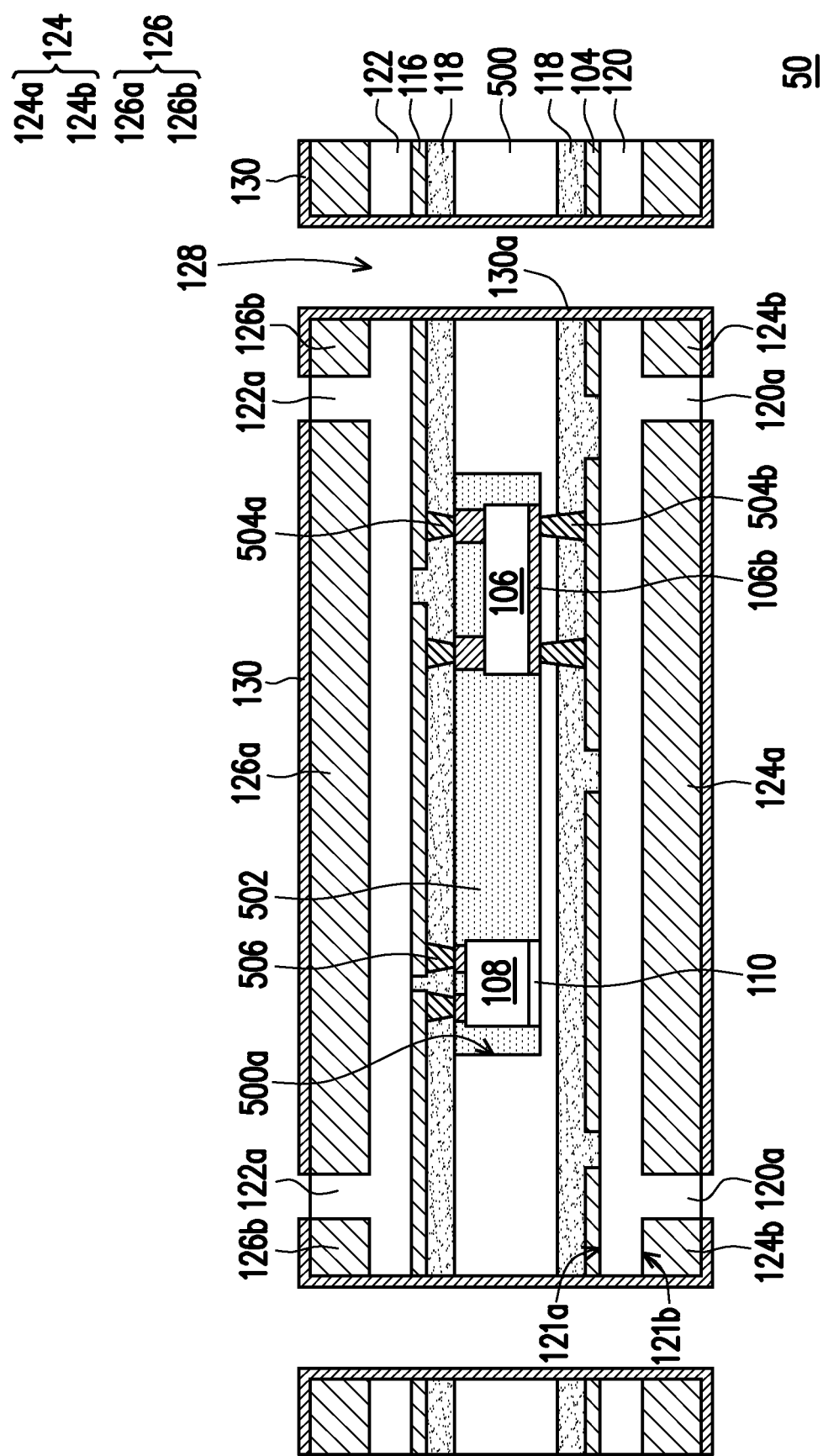
FIG. 5 is a cross-sectional view of a chip package structure according to the fifth embodiment of the present application.

FIG. 5 is a cross-sectional view of a chip package structure according to the fifth embodiment of the present application. In the present embodiment, the same elements as the first embodiment are labeled with the same reference numerals and are not repeated herein.

Please refer to FIG. 5. In the present embodiment, the difference between a chip package structure 50 and the chip package structure 10 is that in the chip package structure 50, the first chip 106 and the second chip 108 are disposed in a groove 500a of a circuit board 500, and an insulating layer 502 completely fills the groove 500a to cover the first chip 106 and the second chip 108. In addition, the encapsulant 118 encapsulates the circuit board 500, a conductive through via 504a is disposed in the encapsulant 118 to be connected to the top electrode 106a of the first chip 106 and the second circuit structure 116, a conductive through via 504b is disposed in the encapsulant 118 and passes through the circuit board 500 to be connected to the bottom electrode 106b of the first chip 106 and the first circuit structure 104, and a conductive through via 506 is disposed in the encapsulant 118 to be connected to the top electrode 108a of the second chip 108 and the second circuit structure 116.

In addition, the chip package structure including the circuit board of the present application may also have a structure similar to the second embodiment, the third embodiment, and the fourth embodiment, and is not repeated herein.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A chip package structure, comprising:
a first insulating layer having a first surface and a second surface opposite to each other;
a first circuit structure disposed at the first surface;
a first chip disposed on the first circuit structure, wherein the first chip has a top electrode and a bottom electrode, and the bottom electrode is electrically connected to the first circuit structure;
a second circuit structure disposed on the first chip and electrically connected to the top electrode;
an encapsulant disposed on the first insulating layer and encapsulating the first circuit structure, the first chip, and the second circuit structure;
a conductive through via disposed in the encapsulant and connected to the first circuit structure and the second circuit structure;
a second insulating layer disposed on the second circuit structure;
a first heat dissipation layer disposed on the second surface; and
a second heat dissipation layer disposed on the second insulating layer,
wherein the first heat dissipation layer and the second heat dissipation layer are electrically insulated from the first chip.

2. The chip package structure of claim 1, wherein the first chip comprises a power chip.

3. The chip package structure of claim 1, further comprising a third circuit structure disposed on the second surface and electrically insulated from the first heat dissipation layer, wherein the conductive through via is disposed in the encapsulant and the first insulating layer and connected to the first circuit structure, the second circuit structure, and the third circuit structure.

4. The chip package structure of claim 1, further comprising a fourth circuit structure disposed on the second insulating layer and electrically insulated from the second heat dissipation layer, wherein the conductive through via is disposed in the encapsulant and the second insulating layer and connected to the first circuit structure, the second circuit structure, and the fourth circuit structure.

5. The chip package structure of claim 1, further comprising a third circuit structure and a fourth circuit structure, the third circuit structure is disposed on the second surface and electrically insulated from the first heat dissipation layer, and the fourth circuit structure is disposed on the second insulating layer and electrically insulated from the second heat dissipation layer, wherein the conductive through via is disposed in the encapsulant, the first insulating layer, and the second insulating layer and connected to the first circuit structure, the second circuit structure, the third circuit structure, and the fourth circuit structure.

6. The chip package structure of claim 5, wherein an upper side and a lower side of the encapsulant have a symmetrical structure.

7. The chip package structure of claim 1, wherein the second insulating layer exposes a portion of the second circuit structure.

8. The chip package structure of claim 1, wherein the second insulating layer covers the entire second circuit structure.

9. The chip package structure of claim 1, further comprising a second chip disposed on the first circuit structure, the second chip has a top electrode, and the top electrode and the second circuit structure are electrically connected.

10. The chip package structure of claim 9, wherein the second chip does not comprise a power chip.

11. The chip package structure of claim 9, wherein the top electrode of the second chip is directly connected to the second circuit structure.

12. The chip package structure of claim 1, wherein the bottom electrode of the first chip is directly connected to the first circuit structure.

13. The chip package structure of claim 1, wherein the top electrode of the first chip is directly connected to the second circuit structure.

14. The chip package structure of claim 1, further comprising a circuit board disposed between the first circuit structure and the second circuit structure, wherein the first chip is located in a groove of the circuit board, and an insulating layer completely fills the groove.

15. The chip package structure of claim 1, wherein the first heat dissipation layer comprises a metal layer.

16. The chip package structure of claim 1, wherein the second heat dissipation layer comprises a metal layer.

17. A chip package structure, comprising:
a first insulating layer having a first surface and a second surface opposite to each other;
a first circuit structure disposed at the first surface;
a first chip disposed on the first circuit structure, wherein the first chip has a top electrode and a bottom electrode, and the bottom electrode is electrically connected to the first circuit structure;
a second circuit structure disposed on the first chip and electrically connected to the top electrode;
an encapsulant disposed on the first insulating layer and encapsulating the first circuit structure, the first chip, and the second circuit structure;
a conductive through via disposed in the encapsulant and connected to the first circuit structure and the second circuit structure;
a second insulating layer disposed on the second circuit structure;
a first heat dissipation layer disposed on the second surface;
a second heat dissipation layer disposed on the second insulating layer; and
a third circuit structure disposed on the second surface and electrically insulated from the first heat dissipation layer, wherein the conductive through via is disposed in the encapsulant and the first insulating layer and connected to the first circuit structure, the second circuit structure and the third circuit structure.

18. A chip package structure, comprising:
a first insulating layer having a first surface and a second surface opposite to each other;
a first circuit structure disposed at the first surface;
a first chip disposed on the first circuit structure, wherein the first chip has a top electrode and a bottom electrode, and the bottom electrode is electrically connected to the first circuit structure;
a second circuit structure disposed on the first chip and electrically connected to the top electrode;
an encapsulant disposed on the first insulating layer and encapsulating the first circuit structure, the first chip, and the second circuit structure;
a conductive through via disposed in the encapsulant and connected to the first circuit structure and the second circuit structure;
a second insulating layer disposed on the second circuit structure;

a first heat dissipation layer disposed on the second surface;

a second heat dissipation layer disposed on the second insulating layer; and a fourth circuit structure disposed on the second insulating layer and electrically insulated from the second heat dissipation layer, wherein the conductive through via is disposed in the encapsulant and the second insulating layer and connected to the first circuit structure, the second circuit structure and the fourth circuit structure.

19. A chip package structure, comprising:

a first insulating layer having a first surface and a second surface opposite to each other;

a first circuit structure disposed at the first surface;

a first chip disposed on the first circuit structure, wherein the first chip has a top electrode and a bottom electrode, and the bottom electrode is electrically connected to the first circuit structure;

a second circuit structure disposed on the first chip and electrically connected to the top electrode;

an encapsulant disposed on the first insulating layer and encapsulating the first circuit structure, the first chip, and the second circuit structure;

a conductive through via disposed in the encapsulant and connected to the first circuit structure and the second circuit structure;

a second insulating layer disposed on the second circuit structure;

a first heat dissipation layer disposed on the second surface;

a second heat dissipation layer disposed on the second insulating layer; and a second chip disposed on the first circuit structure, wherein the second chip has a top electrode, and the top electrode and the second circuit structure are electrically connected.

* * * * *